US010379667B2

United States Patent
An et al.

(10) Patent No.: US 10,379,667 B2
(45) Date of Patent: Aug. 13, 2019

(54) CAPACITIVE TOUCHSCREEN PANEL AND A METHOD FOR ETCHING AN INDIUM TIN OXIDE FILM ON A GAP PORTION OF A CAPACITIVE TOUCHSCREEN PANEL

(71) Applicant: Kunshan Visionox Display Co., Ltd., Kunshan, Jiangsu (CN)

(72) Inventors: Leping An, Jiangsu (CN); Yao Hong, Jiangsu (CN); Long Wang, Jiangsu (CN); Ming Gao, Jiangsu (CN); Peisheng You, Jiangsu (CN)

(73) Assignee: KUNSHAN VISIONOX DISPLAY CO., LTD., Kunshan, Jiangsu (CN)

( * ) Notice: Subject to any disclaimer, the term of this patent is extended or adjusted under 35 U.S.C. 154(b) by 459 days.

(21) Appl. No.: 15/107,301

(22) PCT Filed: Dec. 23, 2014

(86) PCT No.: PCT/CN2014/094621
§ 371 (c)(1),
(2) Date: Jun. 22, 2016

(87) PCT Pub. No.: WO2015/096691
PCT Pub. Date: Jul. 2, 2015

(65) Prior Publication Data
US 2017/0003820 A1   Jan. 5, 2017

(30) Foreign Application Priority Data

Dec. 24, 2013  (CN) .......................... 2013 1 0722462

(51) Int. Cl.
*G06F 3/041* (2006.01)
*B23K 26/362* (2014.01)
(Continued)

(52) U.S. Cl.
CPC .......... *G06F 3/0418* (2013.01); *B23K 26/362* (2013.01); *G06F 3/044* (2013.01);
(Continued)

(58) Field of Classification Search
CPC ....................... B23K 26/362; H01L 21/76894
See application file for complete search history.

(56) References Cited

U.S. PATENT DOCUMENTS 4,970,366 A  * 11/1990  Imatou ............... B23K 26/0853
                                                 219/121.68
6,300,594 B1 * 10/2001  Kinoshita ............ B23K 26/073
                                                 219/121.69
(Continued)

FOREIGN PATENT DOCUMENTS

CN         201788497 U    4/2011
CN         102314272 A    1/2012
(Continued)

OTHER PUBLICATIONS

International Preliminary Report on Patentability for PCT app No. PCT/CN2014/094621 dated Jun. 28, 2016.
(Continued)

*Primary Examiner* — Geoffrey S Evans
(74) *Attorney, Agent, or Firm* — McCarter & English, LLP

(57) ABSTRACT

A capacitive touchscreen panel and a method for etching an indium tin oxide film on a gap portion of a capacitive touchscreen panel, the method for etching comprises using a laser etching line to cut ITO on the gap portion into a plurality of ITO segments, the ITO segments are independent of each other and are not connected to each other. The method for etching an indium tin oxide film on a capacitive touchscreen panel and a gap portion thereof of the present
(Continued)

invention has high production efficiency, and the touch-screen product has a good display effect after etching.

9 Claims, 4 Drawing Sheets

(51) Int. Cl.
    *H01L 21/768*     (2006.01)
    *G06F 3/044*     (2006.01)

(52) U.S. Cl.
    CPC .............. *H01L 21/76894* (2013.01); *G06F 2203/04103* (2013.01)

(56) References Cited

U.S. PATENT DOCUMENTS

| | | |
|---|---|---|
| 8,030,189 B2 | 10/2011 | Lin et al. |
| 9,280,222 B2 | 3/2016 | Jiang |
| 2010/0117985 A1 | 5/2010 | Wadia |
| 2012/0044189 A1* | 2/2012 | Lin ................. G06F 3/044 345/174 |
| 2012/0169664 A1* | 7/2012 | Milne ............. B23K 26/0676 345/174 |
| 2012/0175235 A1* | 7/2012 | Jiang ............... G06F 3/044 200/600 |
| 2012/0319974 A1 | 12/2012 | Kim et al. |
| 2013/0048349 A1* | 2/2013 | Lin ................. G06F 3/044 174/255 |
| 2013/0162552 A1* | 6/2013 | Huang ............. G06F 3/044 345/173 |
| 2013/0176267 A1* | 7/2013 | Carley ............. G06F 3/044 345/174 |
| 2013/0222297 A1 | 8/2013 | Adachi |
| 2014/0124347 A1* | 5/2014 | Jiang .............. G06F 3/041 200/5 A |
| 2014/0267073 A1* | 9/2014 | Chan .............. G06F 3/041 345/173 |
| 2015/0169090 A1* | 6/2015 | Ciou .............. H05K 3/027 345/173 |

FOREIGN PATENT DOCUMENTS

| | | |
|---|---|---|
| CN | 202854790 U | 4/2013 |
| JP | 3167700 | 4/2011 |
| JP | 2013-254246 | 12/2013 |
| KR | 20120111787 | 10/2012 |
| TW | 201111563 A1 | 4/2011 |
| WO | WO 2013/067909 A1 | 5/2013 |

OTHER PUBLICATIONS

Supplemental European Search Report for app No. 14874941 dated Nov. 10, 2016.
English translation of JP 3167700 specification.
Notification of Reasons for Refusal for JP 2016-543157, dated Jun. 16, 2017, with English translation.

\* cited by examiner

“CAPACITIVE TOUCHSCREEN PANEL AND A METHOD FOR ETCHING AN INDIUM TIN OXIDE FILM ON A GAP PORTION OF A CAPACITIVE TOUCHSCREEN PANEL”

FIELD OF THE INVENTION

The present invention refers to panel display field, especially refers to a capacitive touchscreen panel and a method for etching an indium tin oxide film on a gap portion of a capacitive touchscreen panel.

BACKGROUND

A capacitive touchscreen in prior art mainly comprises capacitive touchscreen panel and a flexible circuit board covered by a cover board. Wherein, capacitive touchscreen panel called sensor for short comprises an insulating transparent substrate, a sensing circuit layer and a driving circuit layer. Wherein, the insulating transparent substrate is made of glass or plastic film; the sensing circuit layer is formed by transparent conductive film having a sensing circuit or glass; the driving circuit layer is formed by transparent conductive film having driving circuit or glass, and the driving circuit layer and the sensing circuit layer are respectively arranged on both sides of the insulating transparent substrate.

An indium tin oxide (ITO) film is arranged on the insulating transparent substrate of the capacitive touchscreen panel, comprising a display portion 1 and a gap portion 2, as shown in FIG. 1, the display portion 1 and the gap portion 2 are arranged phase to phase, limited by the requirements of a control chip of the capacitive touchscreen panel, the width of the gap portion 2 is usually 3 mm. As a reason that ITO of the gap portion has a parasitic capacitance and the limitation of requirements of the function supported by the chip, if ITO of the gap portion does not etched, when the product is touched, a touch signal drift will be generated, and the touch recognition accuracy of the product is seriously affected, therefore, ITO of the gap portion must be etched so as to ensure touch accuracy of the product. The method for etching in prior art is shown in FIG. 2, portions between the two graphic laser etching traces 3 are gap portions, gap portion laser etching traces 4 are etched parallel to the graphic laser etching traces 3, as a reason that the range of width of the gap portion is usually [0.2 mm, 0.3 mm], tens of laser etching lines are needed to etch ITO of the gap portion 2. But, the products etched by this method will show obvious etching lines while showing image, in other words, the light transmittance of the etched portions is larger than the light transmittance of the graphics portions of the display portion, thus, image is shown with obvious lines, this situation causes a poor display effect of a touchscreen product, and due to tens of laser processing programs, the production efficiency is very low.

SUMMARY OF THE INVENTION

Thus, one objective of the present invention is to solve the problem of a poor display effect and low production efficiency of products etched by the method for etching an indium tin oxide film on a gap portion of a capacitive touchscreen panel, and providing a capacitive touchscreen panel and a method for etching an indium tin oxide film on a gap portion of a capacitive touchscreen panel having a good display effect and high production efficiency.

To solve the problems, the invention provides a method for etching an indium tin oxide film on a gap portion of a capacitive touchscreen panel, comprising a step of cutting ITO on the gap portion using a laser etching line into a plurality of ITO segments, wherein, the ITO segments are independent from and unconnected to each other.

Preferably, the method for etching further comprises performing cross cutting on the ITO to form a plurality of the ITO segments that are independent from and unconnected to each other using two laser etching lines, and gap portion laser etching traces are formed on the gap portion after using the two laser etching lines.

Preferably, the distance of centerlines of the two laser etching lines is less than the width of one laser etching line in the process of approaching the cross point of the laser etching lines.

Preferably, the two laser etching lines are parallel to each other and partially overlapped at a position close to the cross point.

Preferably, the two laser etching lines are spaced by 0.01 mm.

Preferably, when the distance of the centerlines of the two laser etching lines is larger than the width of one laser etching line during the process of approaching the cross point, a gap between the adjacent ITO segments forms gap portion ITO segments at a position close to the ITO segments on two sides, the gap portion ITO segments are independent and not connected to each other.

Preferably, the length of each ITO segment is 2 mm-4 mm.

Preferably, the length of each ITO segment is 3 mm.

Preferably, the distance between the centerline of the gap portion laser etching traces and the centerline of graphic laser etching traces of the display portion of capacitive touch-screen panel is less than the width of one laser etching line.

Preferably, the width of the gap portion is 0.2 mm-0.3 mm.

The invention also provides a capacitive touchscreen panel, comprising a sensing circuit layer, a driving circuit layer and an insulating transparent substrate having an indium tin oxide film arranged thereon, wherein, the indium tin oxide film comprises a display portion and a gap portion, wherein, the indium tin oxide film of the gap portion is etched by the method for etching.

Compared with prior art, the technical proposal of the invention has advantage of that:

(1) the capacitive touchscreen panel and the method for etching an indium tin oxide film on a gap portion of a capacitive touchscreen panel of the invention uses a laser etching line to cut ITO on the gap portion into a plurality of ITO segments, the ITO segments are independent from and unconnected to each other. After being etched by this method, each ITO segment has a small parasitic capacitance which will not affect the recognition accuracy of a touch signal, and due to the decrease of laser etching lines, the etching lines are not obvious, so as to cause a symmetrical display effect which is almost the same as a display effect of products without being etched, furthermore, since the etching process is simplified, etching one product can save about 50% of the time, the production efficiency is improved.

(2) the capacitive touchscreen panel and the method for etching an indium tin oxide film on a gap portion of a capacitive touchscreen panel of the invention uses two laser etching lines to cross cutting the ITO to form a plurality of the ITO segments that are independent from and unconnected to each other, and the two laser etching lines form gap portion laser etching traces on the gap portion, this method is easy to process.

(3) in the capacitive touchscreen panel and the method for etching an indium tin oxide film on a gap portion of a capacitive touchscreen panel of the invention, the distance of centerlines of the two laser etching lines is less than the width of one laser etching line in the process of approaching the cross point of the laser etching lines, this arrangement ensures that ITO on the gap portion can be cut into a plurality of ITO segments.

(4) in the capacitive touchscreen panel and the method for etching an indium tin oxide film on a gap portion of a capacitive touchscreen panel of the invention, the length of each ITO segment is 2 mm-4 mm, the length is preferably 3 mm, under the limitation of the requirements of a control chip of the capacitive touchscreen panel, ITO with such length has a small parasitic capacitance, which almost will not affect the recognition accuracy of a touch signal, and the product touch accuracy is ensured.

(5) in the capacitive touchscreen panel and the method for etching an indium tin oxide film on a gap portion of a capacitive touchscreen panel of the invention, the distance between the centerline of the gap portion laser etching traces and the centerline of graphic laser etching traces of the display portion of capacitive touch-screen panel is less than the width of one laser etching line, so as to prevent the laser etching lines from etching too many times in the same position to lead a problem of obvious etching lines, the products display effect is ensured.

BRIEF DESCRIPTION OF THE DRAWINGS

In order to make the content of the invention easier to be clearly understood, in the following, with reference to the figures, the specific embodiments of the present invention will be described in detail, wherein.

Numeral reference in figures is as follows.

1—display portion, 2—gap portion, 3—graphic laser etching traces, 4—gap portion laser etching traces, 5—ITO segments, 6—gap, 7—cross point.

DETAILED DESCRIPTION OF EMBODIMENTS

Figure 1:
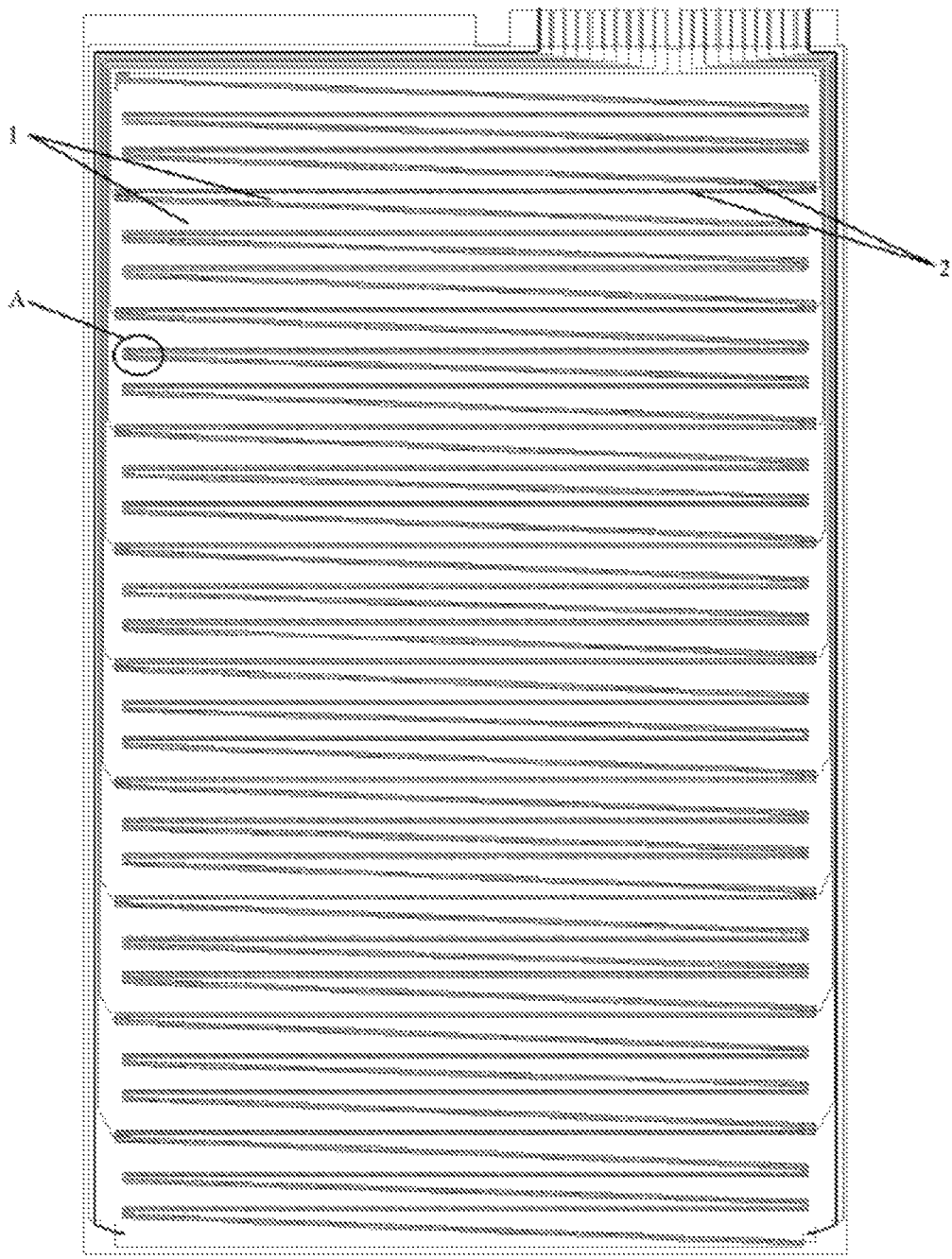
FIG. 1 is a schematic diagram of the capacitive touchscreen panel of the prior art.
Figure 2:
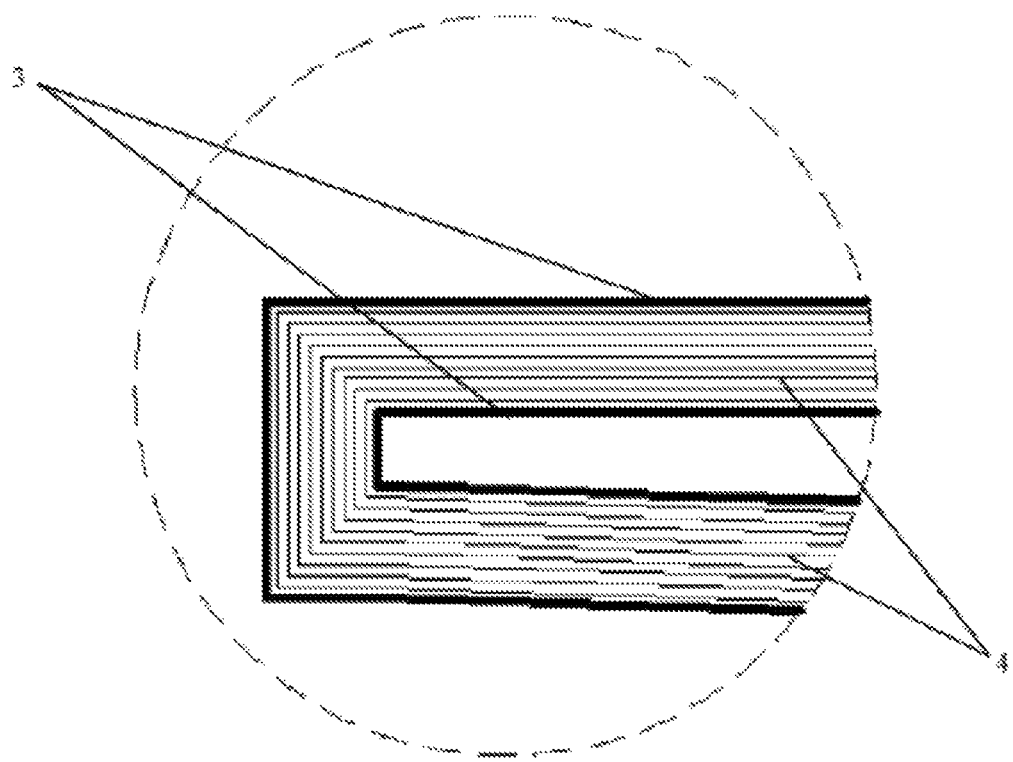
FIG. 2 is an enlarged view of portion A in FIG. 1.
Figure 3:
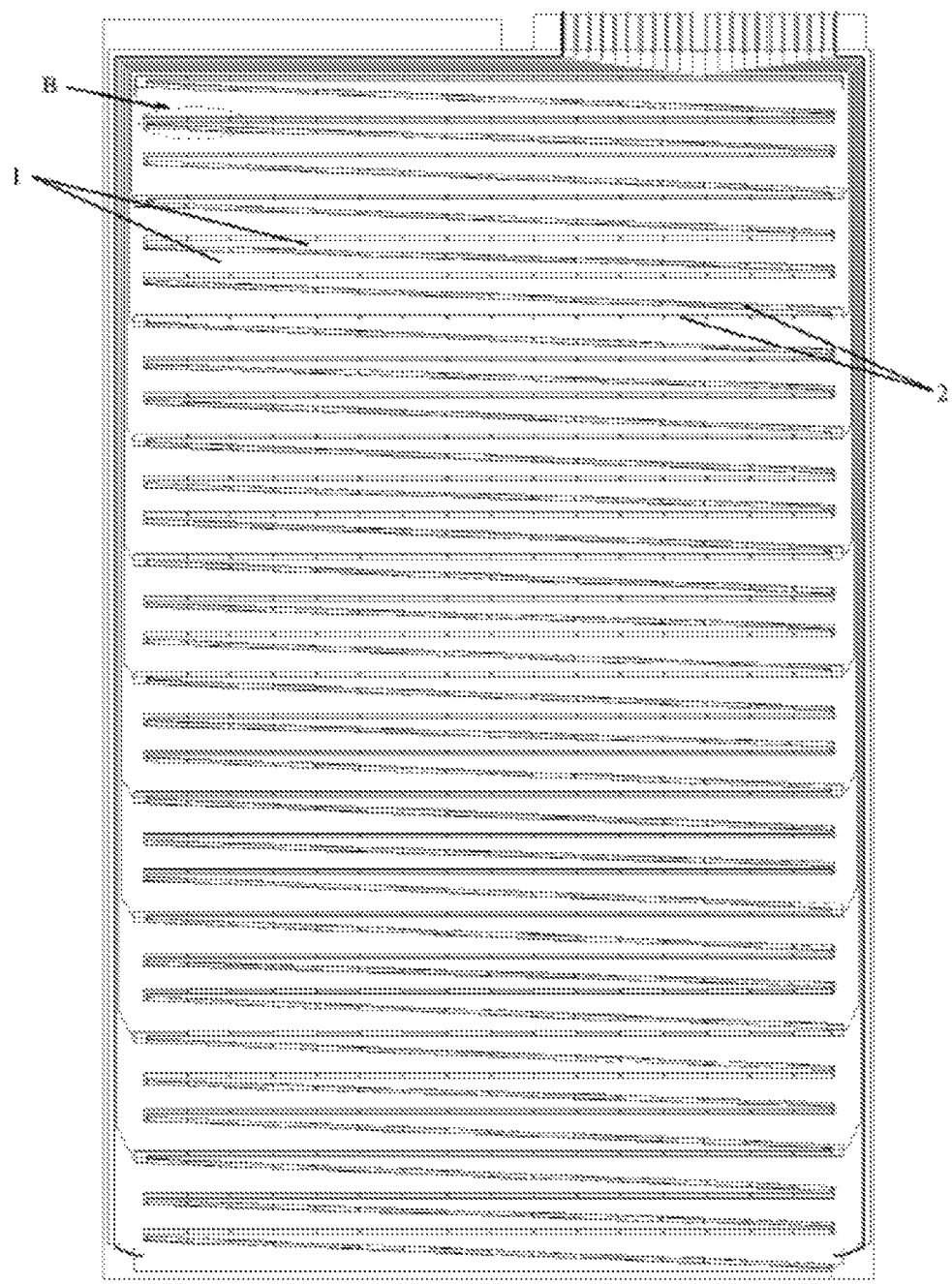
FIG. 3 a schematic diagram of capacitive touchscreen panel of the prior art.
Figure 4:
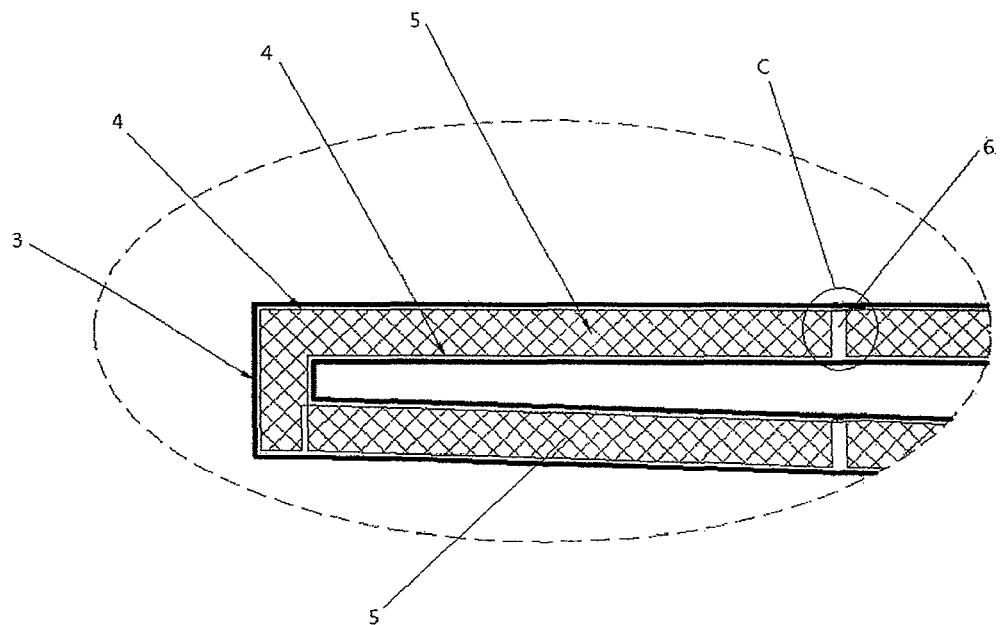
FIG. 4 is an enlarged view of portion B in FIG. 3.
Figure 5:
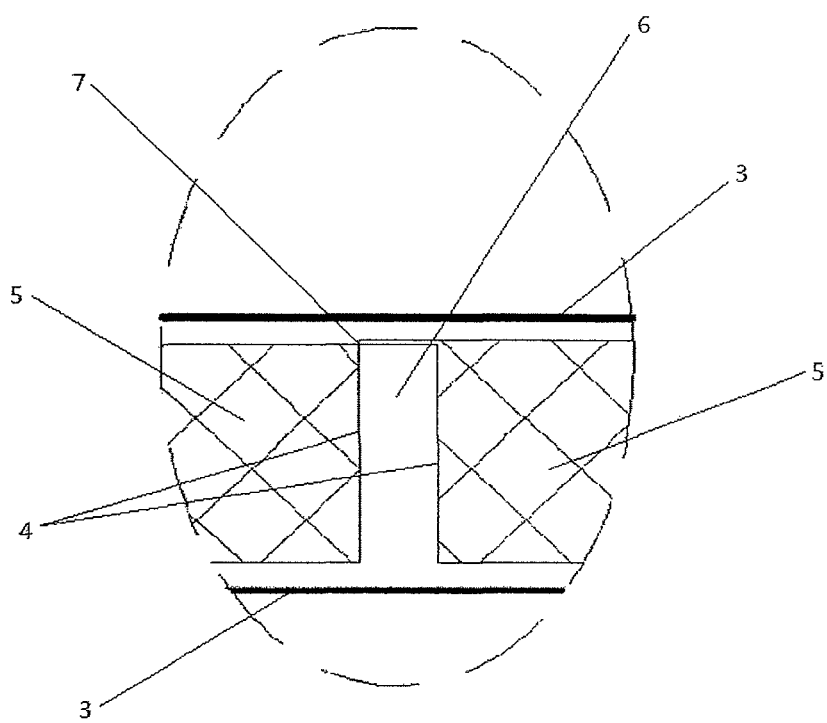
FIG. 5 is an enlarged view of portion C in FIG. 4.

A method for etching an indium tin oxide film on a gap portion of a capacitive touchscreen panel of the invention is shown in FIG. 3-5.

The insulating transparent substrate has an indium tin oxide (ITO) film arranged thereon, and comprises a display portion 1 and a gap portion 2, as shown in FIG. 3, the display portion 1 and the gap portion 2 are arranged in alternating manner; under the limitation of the requirements of a control chip of the capacitive touchscreen panel, the width of the gap portion 2 is usually 0.2 mm-0.3 mm, the width of the gap portion 2 in the present embodiment is preferably 0.3 mm.

While etching ITO on the gap portion 2, a laser etching line is used to cut ITO on the gap portion 2 into a plurality of ITO segments 5. As illustrated in FIG. 4, the ITO segments are independent from and unconnected to each other; in other words, a gap 6 is formed between the adjacent ITO segments 5, and the length of the gap 6 is not specifically defined herein, as long as the adjacent ITO segments can be separated. Each ITO segment has a small parasitic capacitance which will almost not affect the recognition accuracy of a touch signal. The length of each ITO segment 5 is 2 mm-4 mm, in the present embodiment, the length of each ITO segment 5 is preferably 3 mm.

Specifically, the method for etching uses two laser etching lines to perform cross cutting on the ITO to form a plurality of the ITO segments 5 that are independent from and unconnected to each other, and gap portion laser etching traces 4 are formed on the gap portion 2 after using the two laser etching lines. The distance of centerlines of the two laser etching lines is less than the width of one laser etching line in the process of approaching the cross point of the laser etching lines. Besides, the distance between the centerline of the gap portion laser etching traces 4 and the centerline of graphic laser etching traces 3 of the display portion 1 of capacitive touch-screen panel is also less than the width of one laser etching line.

In other embodiments, the two laser etching lines close to the cross point 7 parallel to each other and partially overlapped, and the two laser etching lines are spaced by 0.01 mm.

In other embodiments, when the distance of the centerlines of the two laser etching lines is larger than the width of one laser etching line in the process of approaching the cross point 7, the gap 6 between the adjacent ITO segments 5 forms gap portion ITO segments at a position close to the ITO segments 5 on two sides, the gap portion ITO segments are independent from and unconnected to each other, which are similar to ITO segments 5.

In other embodiments, the length of each ITO segment also can be 2 mm, 2.5 mm, 3.8 m, or 4 mm etc., which is chosen according to products performance requirements.

In other embodiments, according to the different requirements of a control chip, the width of the gap portion 2 also can be 0.2 mm, 0.23 mm, 0.25 mm, or 0.28 mm etc.

Obviously, the above-described embodiments are only examples for clear description, and are not restriction of the mode of enforcement. For ordinary skill men in the field, other changes can be made in different forms on the basis of the above description. There is no need to explain all embodiments here. And the apparent changes or variations still drop the protection scope of the invention.

The invention claimed is:

1. A method for etching an indium tin oxide film on gap portions of a capacitive touchscreen panel, comprising:
    using laser etching to form a first set of laser etching traces and cut the gap portions into a plurality of indium tin oxide segments divided by a plurality of transverse gaps, the indium tin oxide segments being independent from and unconnected to each other, wherein the first set of laser etching traces are formed by laser etching along two lines crossing each other at a plurality of cross points located at the transverse gaps.

2. The method for etching according to claim 1, wherein, at each of the transverse gaps, two centerlines of two laser etching traces from the first set of laser etching traces have a distance less than the width of one laser etching trace from the first set of laser etching traces.

3. The method for etching according to claim 1, wherein, at each of the transverse gaps, the two laser etching traces from the first set of laser etching traces are parallel to each other and partially overlapped.

4. The method for etching according to claim 1, wherein, at each of the transverse gaps, two centerlines of two laser etching traces from the first set of laser etching traces have a distance larger than the width of one laser etching trace from the first set of laser etching traces, and an interposing segment is formed between adjacent ones of the indium tin oxide segments, the interposing segment being independent from and unconnected to the neighboring indium tin oxide segments.

5. The method for etching according to claim 4, wherein, the length of each indium tin oxide segment is 3 mm.

6. The method for etching according to claim 5, wherein, the width of the gap portion is 0.2 mm-0.3 mm.

7. The method for etching according to claim 1, wherein, the length of each indium tin oxide segment is 2 mm-4 mm.

8. The method for etching according to claim 7, wherein, the indium tin oxide film is arranged on an insulating transparent substrate of the capacitive touchscreen panel, the indium tin oxide film comprising display portions and the gap portions arranged on the insulating transparent substrate in an alternating manner and separated by a second set of laser etching traces, wherein, along the etching traces from the second set of laser etching traces, the distance between a centerline of each etching trace from the second set of laser etching traces and a centerline of a neighboring laser etching trace from the first set of laser etching traces is less than the width of one laser etching trace.

9. A capacitive touchscreen panel, comprising a sensing circuit layer, a driving circuit layer and an insulating transparent substrate having an indium tin oxide film arranged thereon, wherein, the indium tin oxide film comprises a display portion and a gap portion arranged on the insulating transparent substrate in an alternating manner and separated by a second set of laser etching traces, wherein, the indium tin oxide film of the gap portion is cut into a plurality of indium tin oxide segments by the method according to claim 1.

* * * * *